United States Patent [19]

Kosugi et al.

[11] 4,179,794

[45] Dec. 25, 1979

[54] PROCESS OF MANUFACTURING SEMICONDUCTOR DEVICES

[75] Inventors: Masao Kosugi; Takashi Ogata, both of Hamamatsu, Japan

[73] Assignee: Nippon Gakki Seizo Kabushiki Kaisha, Shizvoka, Japan

[21] Appl. No.: 893,275

[22] Filed: Apr. 5, 1978

Related U.S. Application Data

[63] Continuation of Ser. No. 705,461, Jul. 15, 1976, abandoned.

[30] Foreign Application Priority Data

Jul. 23, 1975 [JP] Japan .................................. 50-89193

[51] Int. Cl.² ............................................ B01J 17/00
[52] U.S. Cl. ........................................ 29/580; 29/583; 29/588; 148/1.5
[58] Field of Search ........................ 29/580, 583, 588; 148/1.5

[56] References Cited

U.S. PATENT DOCUMENTS

| | | | |
|---|---|---|---|
| 2,948,642 | 8/1960 | MacDonald | 148/1.5 |
| 3,535,774 | 10/1970 | Baker | 29/580 |
| 3,742,599 | 7/1973 | Desmond | 29/588 |
| 3,911,561 | 10/1975 | Quinn | 29/588 |

OTHER PUBLICATIONS

IBM Technical Bulletin, "Low Temp. Forming of SiO₂ Layers," Berkenblit, p. 1297, vol. 13, No. 5, Oct. 1970.

*Primary Examiner*—W. C. Tupman
*Attorney, Agent, or Firm*—Cushman, Darby & Cushman

[57] ABSTRACT

On a common semiconductor wafer constituted by a PN-lamination are formed a number of semiconductor device units. Recessed grooves are formed into this wafer by an etching technique at such sites as one corresponding to the boundaries of the respective adjacent semiconductor device units. To protect the PN-junctions of the wafer exposed on the etched grooves, these surfaces are coated with a thermo-setting resin. Thereafter, the semiconductor wafer is severed apart at the respective recessed grooves into respective individual chips of semiconductor devices.

10 Claims, 10 Drawing Figures

PROCESS OF MANUFACTURING SEMICONDUCTOR DEVICES

This is a continuation, of application Ser. No. 705,461 filed July 15, 1976 now abandoned, which is hereby incorporated by reference.

BACKGROUND OF THE INVENTION (a) Field of the Invention

The present invention concerns a process of manufacturing a semiconductor device having at least one laminated PN-junction.

(b) Description of the Prior Art

Semiconductor devices such as transistors are manufactured, usually, by first forming, simultaneously, a number of semiconductor device units in an adjacent fashion relative to each other on a semiconductor wafer which is composed of, for example, PN lamination, followed by cutting the resulting wafer to sever same into respective individual chips of semiconductor devices, and thereafter sealing these semiconductor devices, respectively, for completion. Said cutting of the wafer is carried out by, for example, the use of a rotating grinding wheel or a scribing machine.

In certain kinds of semiconductor devices, for example, a mesa transistor, those portions skirtingly surrounding the transistor are removed by etching in order to decrease the cross sectional area of the base region thereof. The etching step is performed usually just before cutting such a wafer into a number of independent transistor chips. More specifically, this etching step is carried out by first masking the surfaces of both the base and emitter regions of the respective transistors formed on the semiconductor wafer with a masking material, for example, a wax having the property of resisting the corroding action of the etching solution which is employed. Whereby, those portions of the wafer which are located between the adjacently disposed respective transistors and which are not coated with the wax are etched away, thereby forming the so-called mesa configuration on each of the manufactured transistors. As a result of this etching step, the laminated PN-junction of the wafer located between the base region and the collector region of each transistor is exposed.

The exposed PN-junction which is encountered during the manufacturing process of a semiconductor device tends to provide cause for the degradation of the function of the produced transistor. More specifically, the severed respective chips of transistor are then subjected to the assembling steps including the bonding step and the sealing step to provide completed transistors. However, during the storage of these individual chips of transistor during or prior to the assembling steps referred to above, those regions containing the exposed PN-junctions could be easily damaged or otherwise they are easily contaminated by dust, moisture and the like, resulting in a degradation of the electrical properties of the completed transistors. In order to keep such damage or contamination of the regions containing the PN-junctions from taking place during the storage of the semiconductor devices in the manufacturing process, it is the usual practice to wash the chips of transistor after the completion of the bonding step, or to carry out a further etching by the use of an aqueous solution of sodium hydroxide and thereafter to coat the resulting surfaces of the transistor chips with a protective film consisting of, for example, a silicone resin. According to this type of procedure, however, it is difficult to expect protection of the exposed PN-junctions in the stage prior to the coating of the surfaces of the transistor chips with a protective film, and therefore no sufficient protective effect of these surfaces is attained. The problem of protection of the PN-junctions of semiconductor devices as discussed above also applies equally to semiconductor devices other than the mesa transistors, i.e., to mesa diodes, mesa thyristors, inversed mesa transistors and mesa FET's.

SUMMARY OF THE INVENTION

It is, therefore, an object of the present invention to provide a method of manufacturing a semiconductor device, which effectively prevents the occurrence of damage and contamination of the exposed PN-junction of this semiconductor device throughout its manufacturing process.

Another object of the present invention is to provide a method of manufacturing a semiconductor device, which can produce in a good yield a semiconductor device having an excellent electrical property.

These and other objects as well as the features and advantages of the present invention will become apparent by reading the following detailed description of the preferred embodiments when taken in conjunction with the accompanying drawings which are given simply by way of example.

DETAILED DESCRIPTION OF THE PREFERRED EMBODIMENTS

According to the present invention, there is freshly introduced, between the step of etching those portions located between the adjacent respective semiconductor device units formed on a semiconductor wafer and the subsequent step of cutting apart the semiconductor wafer to provide the respective individual chips of semiconductor devices, a step of coating the surfaces of the recessed grooves which are formed between the adjacent respective semiconductor device units formed on a laminated wafer, with a film of a resin. This film of resin may be removed in the final step of the manufacturing process, or it may be left to exist continuously so as to be utilized as the passivation film of the individual semiconductor device.

Referring now to FIGS. 1A to 1F, description will hereunder be made of an example of the manufacturing process of the mesa NPN-type transistor according to the present invention.

Figure 1A:
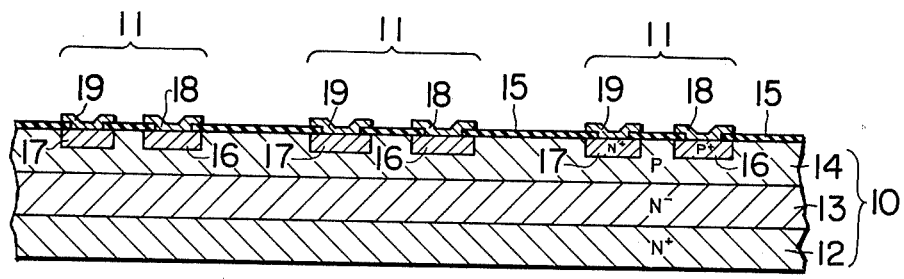
FIGS. 1A through 1F are longitudinal cross sectional views of a mesa transistor during the respective steps of its manufacturing process according to the present invention.

As shown in FIG. 1A, there are formed a number of transistors 11, in mutually closely adjacent fashion, on an N-type semiconductor wafer 10 made of, for example, silicon. This semiconductor wafer 10 may be formed either by relying on a doping technique or by the use of an epitaxial growth technique. For example, an N-type semiconductor layer 13 having a high electrical resistance is caused to grow epitaxially on a substrate 12 made of, for example, silicon having a low electrical resistance to produce a semiconductor wafer 10. A P-type impurity is doped into this semiconductor wafer 10 from the top side thereof to form, within the N-type semiconductor layer 13, a P-type semiconductor layer 14 having a relatively low electrical resistance. This P-type semiconductor layer 14 will constitute the base regions of the respective transistors. Also, the N-type semiconductor layer 13 will constitute the collector regions of the respective transistors 11. Furthermore, the boundary region between the P-type semiconductor layer 14 and the N-type semiconductor layer 13 will constitute a base-collector PN-junction. Next, an insulating film 15 made of, for example, a silicon oxide film is formed on the surface of the P-type semiconductor layer 14. Using this insulating film 15 as the masking member, a P-type impurity and an N-type impurity are selectively doped into the wafer to produce a P-type semiconductor layer 16 having a low electrical resistance and an N-type semiconductor layer 17 having also a low electrical resistance. This N-type semiconductor layer 17 will constitute the emitter region of the transistor 11. Thereafter, the insulating film 15 formed on top of the semiconductor layers 16 and 17 is locally removed by a photo-etching process. Then, a base electrode 18 and an emitter electrode 19 are formed on both of these two semiconductor layers 16 and 17 by relying on, for example, the sputtering technique. The process shown in FIG. 1 may be considered substantially identical with the known method of manufacturing transistors.

Figure 1B:
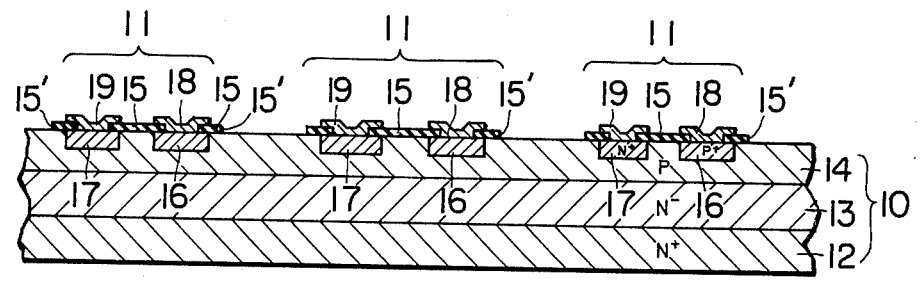

Next, as shown in FIG. 1B, those portions of the insulating layer 15 located at the boundaries of the respective transistors 11 are removed selectively by relying on, for example, a photo-etching technique to provide an opening 15′ having a required dimension.

Figure 1C:
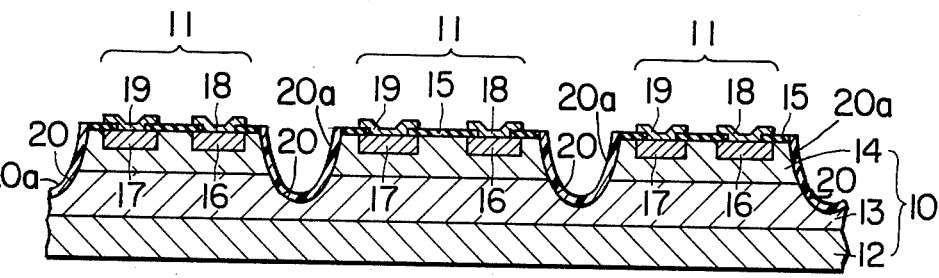

Thereafter, as shown in FIG. 1C, etching is performed, while using the insulating film 15 (or photo-resistive wax, although not shown) as the masking member to remove, through this etching, those portions of the semiconductor layers 13 and 14 located at the opening 15′ of the insulating film 15, to thereby produce recessed grooves 20. On the surface of these grooves 20, there are exposed the PN-junctions of the base region and the collector region. As an alternative for the masking member used in said etching step, there may be used a film coated with a wax having a resistivity to the corroding action of the etching solution employed.

Figure 1D:
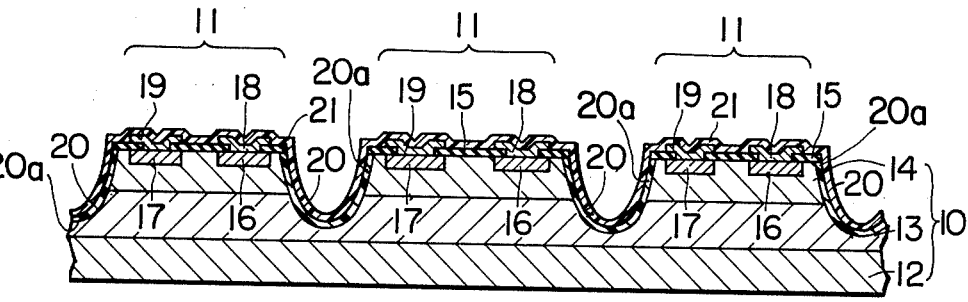

Thereafter, by the use of a spinner, a brush or a spraying means, an uncured thermo-setting resin is applied to the entire top surface of the semiconductor wafer 10. Then, this applied resin is subjected to heating, at an appropriate temperature, to cure this resin. Whereby, as shown in FIG. 1D, there is formed a film 21 of resin covering the entire top surface of the semiconductor wafer 10 containing the surfaces of the recessed grooves 20. By virtue of this film of resin, the PN-junctions previously exposed on the surfaces of the recessed grooves 20 are covered now.

As the resin which can be used as said film 21 a polyimide resin is used which is widely used as an insulating material to be provided between the layers of multi-layered integrated circuits, or between the layers of thin film, multi-layer, integrated circuit substrates. Also, this polyimide resin desirably contains few impurities as possible, and especially, it is desirable that this resin contains Na ions at a concentration value less than 10 ppm. The film 21 of said resin has, for practical purposes, an appropriate thickness of 0.5 μm–5 μm. Furthermore, the film 21 of this resin may be selected to have a thermo-setting temperature of 200° C.–320° C. when the resin is a polyimide resin, although this depends on the rate of etching conducted in the subsequent step.

It is hereby added that, prior to forming the resinous film 21, there is formed on the surfaces of the recessed grooves 20 a silicon nitride film, or a silicon oxide film such as a "stain film" 20a which is a type of silicon oxide film obtained from chemical oxidization (in hydrofluoric and nitric acid liquid or gas) of silicon. For example, a thin stain film having a thickness of the order of 0.05 μm is formed on the surfaces of the recessed grooves 20. On top of this stain film is formed the aforesaid resinous film 21. By doing so, the adhesibility between the resinous film 21 and the surfaces of the recessed grooves 20 is improved, so that the unnecessary scaling or peeling-off of the resinous film 21 can be effectively avoided. Also, instead of the stain film referred to above, it is also possible to use $SiO_2$ which is formed by heat-oxidization, or $SiO_2$ which is obtained by deposition in silane and oxygen gases. Still further, in place of forming the resinous film 21, it may be possible, as the circumstances permit, to form an $SiO_2$ film on the surfaces of the recessed grooves 20 by relying on a heat-oxidizing technique. However, in case a thick $SiO_2$ film is formed on the surfaces of the recessed groove 20, there will arise the problems that the semiconductor wafer 10 is subjected to stresses which, in turn, will tend to cause cracks in the wafer 10, and also that the formation of an $SiO_2$ film undesirably takes much time. These problems, however, will not come to fore when a resinous film 21 is formed.

Figure 1E:
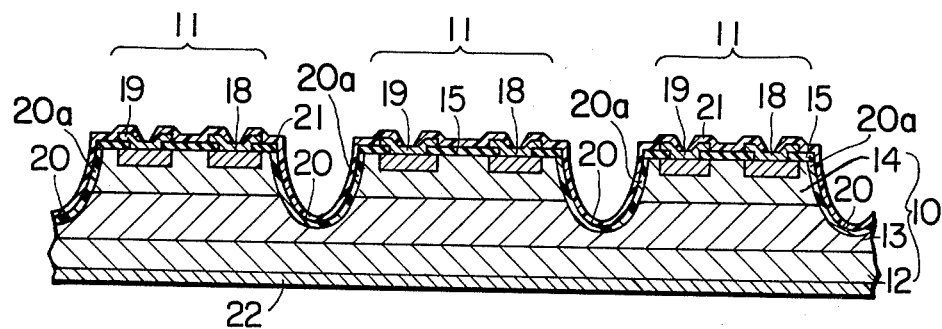

Next, as shown in FIG. 1E, those portions of the resinous film 21 located on top of the base electrode 18 and the emitter electrode 19 are removed to expose these two electrodes 18 and 19. Such local removal of the resinous film 21 may be performed by any of the known techniques such as the photo-etching technique. On the under side surface of $N^+$ layer 12 may be provided a metal layer 22 as a preparation for later soldering.

Figure 1F:
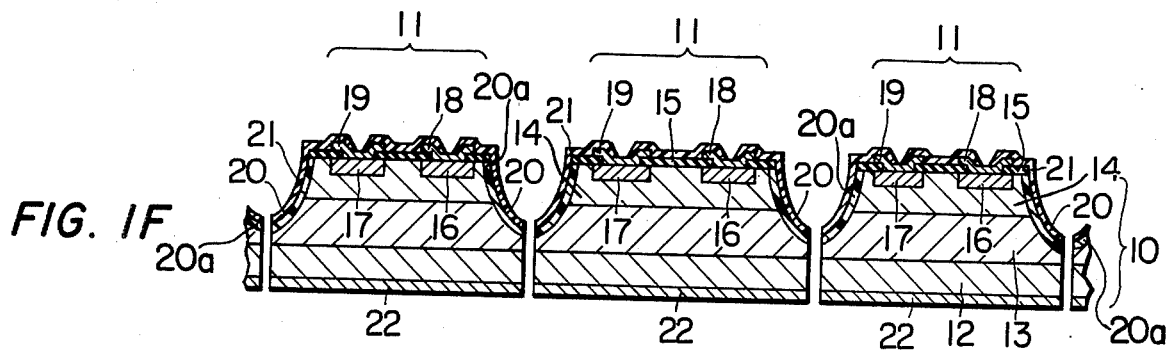

Thereafter, as shown in FIG. 1F, from the boundary regions between the adjacent respective transistors 11, i.e. at the recessed groove portions, the semiconductor wafer 10 is cut apart by a scribing machine or a rotating grinding wheel or the like into individual chips of transistor 11.

Subsequent assembling steps such as the bonding step and the sealing step may be carried out substantially in the same way as those of the known process. Accordingly, their explanation is omitted.

As stated above, according to the present invention, it will be understood that, by the provision of the resinous film which covers the surfaces of the respective recessed grooves 20 which are formed by etching, the PN-junctions which are exposed on these recessed grooves 20 are completely protected. Thus, it will be understood that these PN-junctions can be unfailingly kept from being damaged or contaminated during the subsequent steps of cutting the semiconductor wafer 10 and of assembling and further during the storage of the severed individual chips of transistor.

As stated previously, the above-described resinous film 21 may be left to exist without being removed, so as to be utilized as the passivation film of the complete transistor. However, this resinous film 21 may be removed during a step such as sealing in the assembling steps.

It will be understood clearly to those skilled in the art that the present invention can be applied not only to the above-described mesa transistors, but also equally effectively to the manufacture of mesa diodes, mesa thyristors, inverted mesa transistors and mesa FET's which are shown in FIGS. 2 through 5, respectively.

Figure 2:
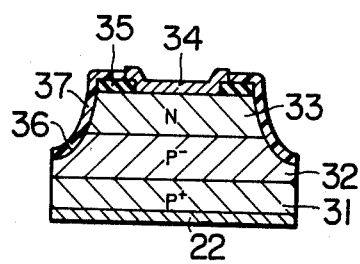
FIGS. 2 through 5 are similar longitudinal sectional views of various types of semiconductor devices obtained according to the manufacturing method of the present invention.

Description will hereunder be directed to outlining the manufacturing process of mesa diodes shown in FIG. 2. There is first prepared a P-type semiconductor wafer which is obtained by forming a P-type semiconductor layer 32 having a high electrical resistance. An N-type impurity is doped into this wafer to produce an N-type semiconductor layer 33. At the opening portion of a silicon oxide film 35, there are formed a number of cathode electrodes 34 on top of said N-type semiconductor layer 33. The respective steps up to the formation of cathode electrodes 34 correspond to those steps shown in FIG. 1A. Then, in a manner similar to that shown in FIG. 1B, a silicon oxide film 35 (or photoresistive wax, although not shown) is used as a masking member to etch those portions of the semiconductor layers 32 and 33 which are located at the peripheral portions of the respective cathode electrodes 34. Then, on the surfaces of the respective recessed grooves 36 which are formed by said etching a resinous film 37 is formed in a manner similar to that shown in FIG. 1C. Thereafter, in a manner similar to that shown in FIGS. 1E and 1F, the whole assembly is cut into independent individual chips of diode. The explanation of the subsequent steps is omitted.

Figure 3:
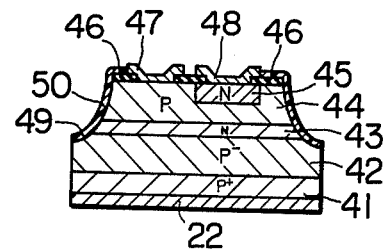

The manufacturing process of the mesa thyristors shown in FIG. 3 is as follows. First, there is prepared a P-type semiconductor wafer by forming a P-type semiconductor layer 42 having a high electrical resistance, on top of a P-type semiconductor substrate 41 having a low electrical resistance. An N-type impurity and a P-type impurity are doped successively into this wafer to produce an N-type semiconductor layer 43 and a P-type semiconductor layer 44 thereon. Then, a silicon oxide film 46 is used as a masking member to carry out selective doping of an N-type impurity to form an N-type semiconductor layer 45 as shown. Furthermore, said silicon oxide film 46 is locally removed to form a gate electrode 47 and a cathode electrode 48. These steps stated above correspond to those shown in FIG. 1A. Subsequently, in a manner similar to that shown in FIG. 1C, a silicon oxide film 46 is used as a masking member to carry out selective etching of those semiconductor layers 42, 43 and 44 which are located in the boundary regions between the respective thyristors, to thereby form recessed grooves 49. Thereafter, in a manner similar to that shown in FIG. 1D, a resinous film 50 is formed. Then, after the completion of the steps which are similar to those shown in FIGS. 1E and 1F, the resulting semiconductor wafer is cut apart into respective individual chips of thyristor. It should be understood that in the instant example, two PN-junctions are exposed on the surface of the recessed groove 49.

Figure 4:
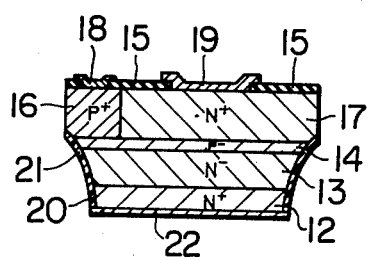

The inverted mesa or the negative bevel transistor shown in FIG. 4 can be produced in substantially the same manufacturing process as for the production of the mesa transistors. Therefore, the explanation of the manufacturing process of the inverted mesa transistor is omitted, and simply like-reference numerals are assigned to those portions similar to those shown in FIGS. 1A through 1F. It should be understood, however, that in this instant example, etching is carried out, starting at the semiconductor substrate side 12 to form a downwardly facing recessed grooves 20.

Figure 5:
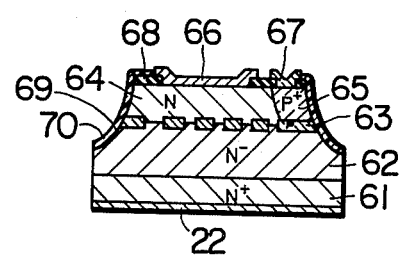

The mesa FET shown in FIG. 5 is of a structure similar to a known junction-type vertical FET, with the exception that its source region is constructed into a mesa configuration. The manufacturing process of this mesa FET comprises firstly carrying out an epitaxial growth of an N-type semiconductor layer 62 (drain layer) having a high electrical resistance, on top of an N-type semiconductor substrate 61 having a low electrical resistance. This is followed by the formation of a mesh-like P-type semiconductor layer 63 having a low electrical resistance which will serve as the gate layer. Furthermore, an N-type semiconductor layer 64 which will serve as the source layer is formed by epitaxial growth. Thereafter, a P-type impurity is doped into this N-type semiconductor layer 64 to form a P-type semiconductor layer 65 having a low electrical resistance and being coupled to said gate semiconductor layer 63. Then, a source electrode 66 and a gate electrode 67 are formed at the opening regions of a silicon oxide film 68. These steps stated above correspond to those steps shown in FIG. 1A. Then, in accordance with the steps similar to those shown in FIGS. 1B through 1C, recessed grooves 69 are formed. Thereafter, in a manner similar to that shown in FIG. 1D, a resinous film 70 is formed. Subsequently, in a manner similar to that shown in FIG. 1F, the wafer as a whole is severed into respective individual chips of FET. In this example, PN-junctions which are produced between the P-type semiconductor layers 63, 65 which serve as the gate layer and the gate lead-out layer respectively and the N-type semiconductor layers 62, 64 which serve as the drain layer and the source layer respectively are exposed on the surfaces of the recessed grooves 69.

The present invention is effectively useful not only in the manufacture of those semiconductor devices which have been described above, but also to the manufacture of semiconductor devices which are produced by a process containing the step of forming recessed grooves through the step of etching which is conducted prior to carrying out the cutting of the semiconductor wafer and which has PN-junctions exposed on the surfaces of said recessed grooves. It should be noted especially that the present invention only additionally includes the heretofore new step of covering the etched bare recessed grooves with a resinous film, and thus the present invention has the advantage that the conventional manufacturing process can be easily conducted substantially without any modification of the steps of such a known manufacturing process.

We claim:

1. In a process of manufacturing a plurality of semiconductor devices, including the successive steps of:
    (a) forming a number of semiconductor device units in mutually adjacent fashion, on top of a common semiconductor wafer;
    (b) etching those portions of said semiconductor wafer located between the respective semiconductor device units to form recessed grooves between the peripheral regions of the respective semiconductor device units; and
    (c) cutting apart said semiconductor wafer at the recessed groove portions into individual semiconductor devices,
    the improvement of preventing damage and contamination of exposed portions of the semiconductor units comprising after step (b) and before step (c) conducting the successive steps of:

(d) forming a stain film having a thickness of the order of 0.05 micrometers by chemical oxidation of silicon on the entire surfaces of said recessed grooves immediately after the etching step (b), whereby the surfaces of the recessed grooves are protected from contamination, and the adhesion between the surfaces of the recessed grooves and a subsequently applied thermosetting resinous film is improved; and thereafter (e) covering and adhering to said stain film on the recessed grooves a thermosetting resinous film, prior to the cutting of step (c).

2. A process according to claim 1, in which said step (d) is also a lightly etching step.

3. A process according to claim 1 wherein the step of forming said stain film by chemical oxidation of silicon includes chemical oxidation by means of hydrofluoric and nitric acids.

4. A process according to claim 1 wherein said resinous film in step (e) is applied by first applying an uncured thermosetting resin to the stain film on the recessed grooves and the heat curing the thus applied resin.

5. A process according to claim 4 wherein said resin is a polyimide resin.

6. A process according to claim 1 wherein the stain film of step (d) is formed by chemical oxidation using hydrofluoric acid.

7. A process according to claim 1 wherein the stain film of step (d) is formed by chemical oxidation using nitric acid.

8. In a process of manufacturing a plurality semiconductor devices, including the successive steps of:

(a) forming a number of semiconductor device units in mutually adjacent fashion on top of a common silicon semiconductor wafer;

(b) etching those portions of said semiconductor wafer located between the respective semiconductor device units to form recessed grooves between the peripheral regions of the respective semiconductor device units; and (c) cutting said semiconductor wafer apart at the recessed groove portions into individual semiconductor devices, the improvement subsequent to step (b) and before step (c) comprising:

(1) forming a stain film having a thickness of about 0.05 micrometers by chemically oxidizing the exposed silicon over the entire surfaces of said recessed grooves after the etching step (b), whereby the surfaces of the recessed grooves are protected from contamination and adhesion between the surfaces of the recessed grooves and the subsequently applied thermosetting resinous film is improved; and thereafter (2) covering said stain film on the recessed grooves with a thermosetting resinous film having a thickness of 0.5 to 5 micrometers, prior to the cutting of step (c) which film adhers to said stain film, whereby damage and contamination of the exposed portions of the semiconductor units is substantially completely prevented.

9. The process according to claim 8 wherein the stain film of step (d) is formed by chemical oxidation using hydrofluoric acid.

10. The process according to claim 8 wherein the stain film of step (d) is formed by chemical oxidation using nitric acid.

* * * * *